(12) United States Patent
Hooghan et al.

(10) Patent No.: US 8,013,428 B2
(45) Date of Patent: Sep. 6, 2011

(54) WHISKER-FREE LEAD FRAMES

(75) Inventors: Kultaransingh N. Hooghan, Murphy, TX (US); John W. Osenbach, Kutztown, PA (US); Brian Dale Potteiger, Reading, PA (US); Poopa Ruengsinsub, Bangkok (TH); Richard L. Shook, Fogelsville, PA (US); Prakash Suratkar, Bangalore (IN); Brian T. Vaccaro, Mertztown, PA (US)

(73) Assignee: LSI Corporation, Milpitas, CA (US)

( * ) Notice: Subject to any disclaimer, the term of this patent is extended or adjusted under 35 U.S.C. 154(b) by 141 days.

(21) Appl. No.: 12/462,069

(22) Filed: Jul. 28, 2009

(65) Prior Publication Data
US 2009/0291321 A1    Nov. 26, 2009

Related U.S. Application Data

(63) Continuation of application No. 10/951,430, filed on Sep. 28, 2004, now abandoned.

(51) Int. Cl.
*B32B 15/20* (2006.01)
*H01L 23/495* (2006.01)
*H01L 23/28* (2006.01)
*C22F 1/08* (2006.01)

(52) U.S. Cl. ........ 257/666; 257/687; 257/787; 428/647; 428/648; 428/929; 428/941; 148/536; 148/537; 29/827; 427/383.7; 174/521; 174/565

(58) Field of Classification Search ............. None
See application file for complete search history.

(56) References Cited

U.S. PATENT DOCUMENTS

| | | | |
|---|---|---|---|
| 3,498,823 A | 3/1970 | Miller et al. | |
| 3,573,008 A | 3/1971 | Akin | |
| 4,014,660 A | 3/1977 | Schreiner et al. | |
| 4,707,724 A * | 11/1987 | Suzuki et al. | 257/677 |
| 5,614,328 A | 3/1997 | Suzuki et al. | |
| 5,780,172 A | 7/1998 | Fister et al. | |
| 5,863,493 A | 1/1999 | Achari et al. | |
| 6,207,298 B1 | 3/2001 | Fukui | |
| 6,296,722 B1 | 10/2001 | Nishimura | |
| 6,602,777 B1 | 8/2003 | Kao et al. | |

(Continued)

FOREIGN PATENT DOCUMENTS

JP    54-110140    *    8/1979

(Continued)

OTHER PUBLICATIONS

Dongkai Shangguan, "Lead-Free Solder Interconnect Reliability," ASM International, 2005, pp. 34-37 and 63.

(Continued)

*Primary Examiner* — John J Zimmerman
(74) *Attorney, Agent, or Firm* — Ottersteft, Ellenbogen & Kammer, LLP

(57) ABSTRACT

A method of fabricating an interconnection between a region of copper material and a conducting region is disclosed. The method includes a step of forming a region of tin material and a step of forming a region of nickel material. The method also includes a step of melting the tin material to induce formation of a nickel/tin/copper intermetallic composition at an interface between the region of copper material and the conducting region. The region of tin material and the region of nickel material define the interface between the region of copper material and the conducting region.

16 Claims, 2 Drawing Sheets

U.S. PATENT DOCUMENTS

| | | |
|---|---|---|
| 6,669,077 B1 | 12/2003 | Kawashima et al. |
| 7,462,926 B2 * | 12/2008 | Fu et al. .................. 257/677 |
| 2003/0197277 A1 | 10/2003 | Yamamoto et al. |
| 2003/0234453 A1 * | 12/2003 | Liu et al. ................... 257/778 |
| 2004/0126269 A1 * | 7/2004 | Nozawa et al. ............. 420/558 |
| 2004/0262370 A1 | 12/2004 | Ano |
| 2004/0265618 A1 * | 12/2004 | Tsuji et al. .................. 428/648 |
| 2005/0153532 A1 | 7/2005 | Osenbach et al. |
| 2007/0126096 A1 * | 6/2007 | Fu et al. ..................... 257/677 |

FOREIGN PATENT DOCUMENTS

| | | |
|---|---|---|
| JP | 56-017048 | 2/1981 |
| JP | 60-194062 | * 10/1985 |
| JP | 04-235292 | 8/1992 |
| JP | 04-329891 | * 11/1992 |
| JP | 10-60666 | * 3/1998 |
| JP | 2002-226982 | * 8/2002 |
| JP | 2003-82499 | * 3/2003 |

OTHER PUBLICATIONS

Max Hansen, "Constitution of Binary Alloys," McGraw-Hill Book Company, 1958, pp. 684-685 and 1042-1043.

* cited by examiner

WHISKER-FREE LEAD FRAMES

CROSS-REFERENCE TO RELATED APPLICATION(S)

This application is a continuation of U.S. patent application Ser. No. 10/951,430, filed on Sep. 28, 2004, now abandoned, the disclosure of which is incorporated by reference herein.

TECHNICAL FIELD

This invention relates to tin-containing interconnects for electronic and electrical devices and in particular to tin-containing interconnects that avoid formation of tin whiskers.

BACKGROUND OF THE INVENTION

For electrical and electronic devices, typically electrical connections are made through the expedient of a lead frame or other copper containing structures. For example, in the fabrication of integrated circuits, a silicon body having electronic circuitry is connected to a metal e.g. copper, lead frame such as shown in FIG. 1 at 2 with the chip positioned at 3 and connections between bonding pads on the chip and the lead frame shown at 4. After the chip is bonded to the lead frame, the chip is encapsulated typically in a polymer composition. The strip, 6, in FIG. 1 is removed from the lead frame in a process generally denominated trimming. Thus, after trimming, the individual leads, 7, are no longer mechanically connected on one end. The leads are then bent to facilitate connection to other electronic or electrical bodies such as a circuit board. Generally the bending involves the formation of at least one curve such as shown in FIG. 2 for typical interconnection of an integrated circuit with a circuit board.

For many applications, the interconnection between the lead frame and another electronic or electrical entity is formed using a lead/tin solder alloy. However, such alloy does not readily wet copper. Therefore, the copper leads are typically coated, e.g. plated, with a layer of tin to enhance wetting of the leads by solders before trimming. Although the tin layer does in fact facilitate wetting of the copper leads, other problems are generated. In particular, there is a tendency to form long needle-like tin structures generally denominated whiskers. These structures are usually from 20 to 100 µm in length and can grow to as long as 1 mm or more. (The whiskers are most often single crystal structures, but multi-crystal whiskers are also possible.) The exact interaction between the copper and tin producing such crystallites is not precisely known. It has been postulated that copper and tin form an intermetallic material in a manner that leads to regions of excess tin. These regions, it is contemplated, are under compressive stress, particularly at the curved sections of the lead frame after bending. The combination of excess tin and compressive stress enhances the tendency to form whisker structures. The occurrence of, and thus the problem associated with, whiskers are exacerbated because they also form when Sn is plated on brass, alloy 42 and other commonly used electronic interconnect metallization structures.

Decades ago, it was found that if, elemental lead (Pb), is added to the tin coating, whisker formation is essentially eliminated. Thus the issue of whiskers has not imposed reliability risks on electronic devices with Pb-doped tin plated leads. However, impending legislation particularly in European countries prohibits the use of lead for many applications including some involving electronic and electrical devices. Thus, there has been a substantial impetus to remove lead from the tin coating. Such removal has the potential for renewing whisker formation as an issue to be considered.

For similar reasons, use of lead-free solder is also being promoted. Such solders melt generally at temperatures above 217° C., and in application, for process control reasons, are typically used at temperatures above 240° C. Since such temperatures exceed the melting point of tin (approximately 232° C.), concerns about tin whiskers have been mitigated since such whiskers are melted during the soldering process. Accordingly, it would appear that the difficulties associated with whiskers such as inadvertent shorting of lead frames or blocking of optical paths for electro-optic devices need not be a substantial concern.

SUMMARY OF THE INVENTION

Surprisingly it has been found that tin whiskers are present even after soldering with materials having been subjected to soldering temperatures above 232° C. Thus the issues associated with such whiskers remain with lead-free solders. By practice of the invention, such whiskers are essentially totally avoided without the expedient of adding lead to the tin coating of the lead frame. Such results are achieved in one embodiment by forming on the lead frame a nickel/tin composition having from 1 to 12 weight percent nickel relative to tin. Such composition results in formation of an intermetallic compound with copper such that essentially no free tin remains. Additionally, this copper/nickel/tin intermetallic has an essentially planar surface and thus is mechanically quite stable. As a result, tin whiskers are avoided and the resultant solder connection is mechanically robust.

Additionally, the mechanical stability afforded by use of the invention is useful even in applications where whisker formation is not a consideration. For example, in certain applications, solder regions on an integrated circuit package (regions generally denominated bumps and/or balls) are connected to pad regions on a circuit board. Such connection is accomplished through processes such as by aligning regions on the die to corresponding regions on the package substrate with subsequent cohesion of the aligned regions. In one common lead free application, a tin/silver, tin/copper, or tin/silver/copper solder alloy is used to connect an aluminum pad on an integrated circuit (IC) to the metal pad of a package substrate. To expedite this attachment the aluminum pad on the IC is coated with a solder friendly metal system. Such system includes an adhesion layer, a barrier layer and a solder wettable layer. (Examples of such solder friendly systems include titanium/nickel-doped with vanadium/copper; aluminum/nickel-doped with vanadium/copper; chromium/chromium-copper/copper; electroless nickel/immersion gold; and copper/nickel.) The metal substrate pad is possibly bare copper but is often coated with materials such as electroless nickel/immersion gold or electrolytic nickel/gold. Similarly the substrate is connected to the board with a lead free solder alloy. Exemplary substrate metallization are copper, copper coated with electroless nickel/immersion gold, and copper coated with electrolytic nickel/electrolytic gold.

The interaction between the tin of the solder and the copper from any of the solder pad metal interfaces (die, substrate, or board) has the potential to produce mechanical instabilities with concomitant reliability issues often characterized by very non-planar interfaces. Through the use of nickel in the solder in the range of 1 to 12 weight percent relative to tin, a robust planar intermetallic compound is formed that substantially reduces the proclivity to induce mechanical instabilities often arising when such an interface is not present. Thus, even in applications where whiskers are not a consideration, but where tin materials promote mechanical instabilities the invention is nevertheless advantageously employed.

DETAILED DESCRIPTION OF THE INVENTION

The presence of nickel in appropriate proportions to tin on a copper containing structure, such as those containing copper and/or copper alloy including brass, or lead frame materials such as alloy 42, avoids problems associated with whisker formation and substantially mitigates mechanical weakness. To achieve such results, the nickel should be present with tin at an interface with copper so that the weight of nickel relative to the tin is in the range 1 to 12 percent of the weight of tin present. Advantageously, the weight of nickel should be 3 to 7 weight percent to that of tin and most advantageously 4 to 6 weight percentage of nickel to tin. Although an exact atomistic explanation for the interaction of the nickel, tin, and copper is not presently resolved, it is contemplated that copper and nickel together with tin form an intermetallic compound and that compositions formed by employing tin and nickel in the appropriate proportions yield an essentially complete reaction, i.e. consumption of the tin such that unreacted tin is essentially absent. Thus after reaction there is essentially no excess elemental non-bound tin present at an interface with copper. Since elemental non-bound tin is required to form whiskers, whiskers are precluded. Additionally, the complete reaction of the tin yields a substantially planar surface for the copper/nickel/tin intermetallic compound and thus a stronger mechanical bond.

Figure 1:
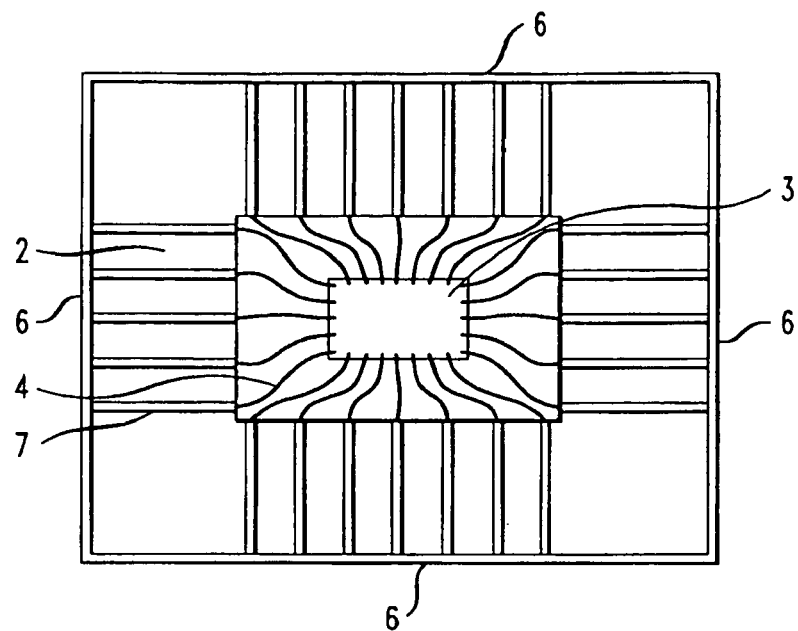
FIGS. 1 and 2 are illustrative of typical lead frame configurations.
Figure 2:
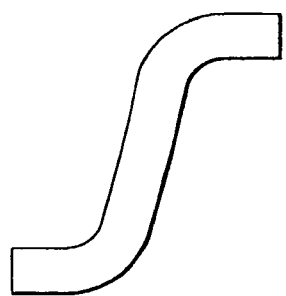
Figure 3:
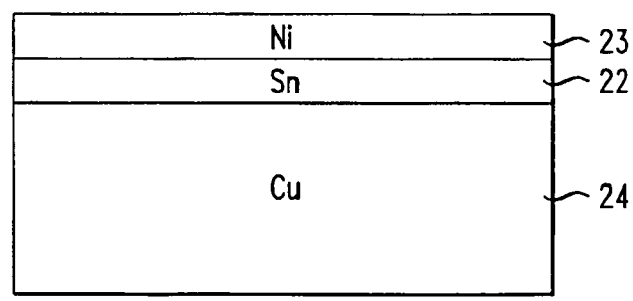
FIGS. 3 through 5 exemplify structures involved in the invention.
Figure 4:
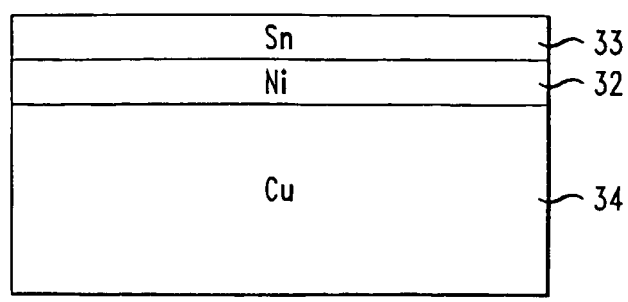

For the desired intermetallic composition to form, the tin should be melted, for example, during a soldering process. Since the melting point of copper is 1,083° C. and the melting point of nickel is 1,453° C., melting of these metals for essentially all electronic and electrical applications is not practical. Thus, before melting, the three metals should be positioned geometrically so that their interaction to form an intermetallic compound is possible through diffusion at temperatures near the melting point of tin, i.e. temperatures in the range of about 232° C. to 270° C. where significant degradation of organic substrates and/or packaging materials is avoided. Since nickel is a slow diffuser in tin, it is typically disadvantageous to have a structure before melting such as shown in FIG. 3. As shown in FIG. 3, when the tin, 22, melts, nickel, 23, must diffuse through the molten tin to interact with the copper, 24. (If the time is sufficiently long, e.g. in the range 60 to 600 seconds and the temperature sufficiently high, e.g. 232° C. to 300° C., then such a structure is useful but relatively inconvenient to employ.) In contrast the structure shown in FIG. 4 is preferred since at temperatures around 240° C. copper, 34, and nickel, 32, interact with the tin, 33 rapidly forming an intermetallic of the correct composition with a planar surface.

Generally, for the copper diffusion through and nickel consumption in molten tin to be advantageous in a reasonable period of time, the nickel region between the tin and copper should have a thickness in the range 0.05 μm to 1.0 μm. Thicknesses less than 0.05 μm often contain porosity which promote uncontrolled reactions and non-planar boundaries. Furthermore, such nickel thicknesses require corresponding tin thicknesses that are prone to damage during the trim and lead bending process. Thicknesses greater than approximately 1 μm generally yield inadequate nickel/copper interaction with the tin under typical electrical device thermal excursions. Alternatively, it is possible to plate or otherwise form an alloy of tin and nickel in the appropriate weight percentages onto the copper containing structure. (The combination of nickel and tin need not be an alloy. It is possible to use other nickel/tin compositions such as nickel/tin/silver, nickel/tin/silver/copper, or nickel/tin/copper.) The presence of other materials such as those typically used to modify the properties of copper are not precluded. For example, copper is often alloyed with materials such as iron to enhance properties such as mechanical stability. The presence of such modifying materials generally does not preclude the advantages of the invention.

Figure 5:
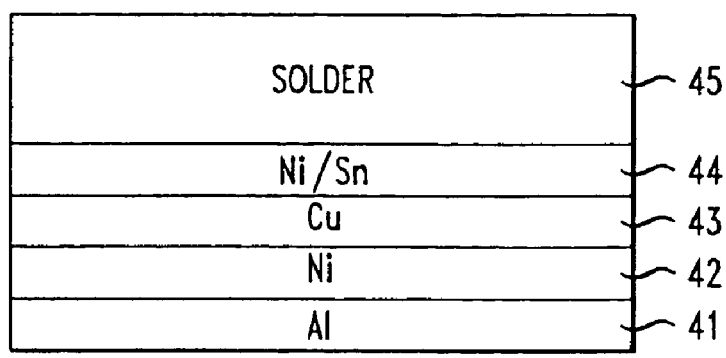

The method of forming the desired nickel and tin regions is not critical. Techniques such as vapor deposition, physical deposition, electroplating, or paste printing lead to useful results. As discussed, the invention relies on the appropriate presence of tin/nickel/copper at an interface where whiskers are to be avoided and/or mechanical stability is required. Although a composition of nickel/tin having a proportion in the range 1 to 12 weight percent produces the desired result, it is possible to include in the final device structure other regions of tin remote from a copper interface. For example, as shown in FIG. 5, an aluminum pad, 41, is overlaid by a region of nickel, 42, and copper, 43. The copper is interfaced with a region, 44, having the appropriate weight percentage of nickel to tin. This region in turn is overlaid by a larger region of tin-based solder, 45. Since the nickel is present at the copper interface upon melting, the appropriate proportions for copper/nickel/tin intermetallic having the desired property is maintained by applying a thermal treatment generally involving temperatures greater than 232° C. for tines greater than 5 seconds to insure that the proper composition of nickel and tin are provided at the copper interface.

To produce the desired intermetallic and to avoid excess tin at a copper interface, the structure should be heated to a temperature that allows tin to melt. Typically, temperatures in the range 232° C. to 270° C. are employed. At temperatures below, 232° C. no substantial tin melting occurs, while at temperatures above 270° C. degradation of typical packaging polymers occurs. However, if employed on ceramic, metal, or metal/ceramic packages, temperatures up to 500° C. may be used without unacceptable degradation of the package materials. Typically the desired intermetallic material is formed in a time period between 5 and 120 seconds for temperatures in the advantageous range. Thus, generally, the temperature should be maintained in the desired range for such time periods. Times less than 5 seconds are undesirable since inadequate reaction to form the desired intermetallic is a frequent occurrence, while time periods greater than 120 seconds, although not precluded, are typically not economic.

Although not required, it is possible to anneal the structure after formation of the desired intermetallic composition. Generally, annealing temperatures in the range 100° C. to 200° C. are useful in conjunction with annealing times in the range 0.5 hours to 8 hours. Subsequent processing of the device after intermetallic formation in the desired annealing range eliminates the need for a specific annealing step. However, generally, processing at temperatures above 270° C. should be avoided with organic packaging materials due to their excessive degradation.

As discussed, an intermetallic compound is formed at a copper containing interface in an interconnection. This intermetallic material in one embodiment is characterized by a percentage of unbound occluded tin less than approximately 15 weight percent relative to the total free Sn content in the interconnection. (In one advantageous embodiment the occluded tin is essentially absent.) The intermetallic composition is also characterized in one embodiment by a surface having a planarity of at least +/−0.9 µm. (Planarity is this context is defined as maximum variation in thickness from peak to valley across the intermetallic interface.)

The following example exemplifies processes, conditions, and compositions involved in the subject invention.

EXAMPLE

Figure 6:
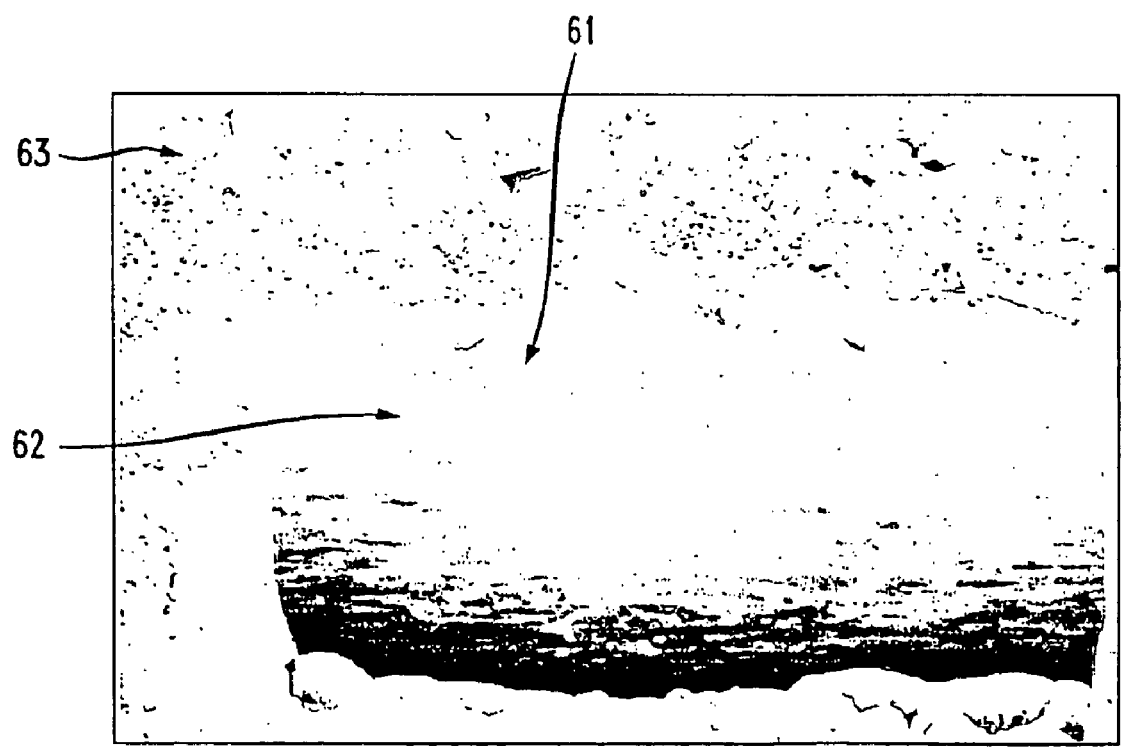
FIG. 6 demonstrates results achieved with the invention.

A 0.25 µm thick nickel layer was electroplated onto a copper lead frame. Subsequently a 3 µm thick tin layer was electroplated onto the nickel layer. On a weight percentage basis the sample contains approximately 4% nickel and 96% tin. The device was then subjected to a 150° C. 1 hour anneal. Finally the device was subjected to a typical solder reflow process with a peak temperature of 260° C. The time the device was at 260° C. was approximately 18 seconds. A secondary electron image was taken from a focused ion beam cross section of the sample. As shown in FIG. 6, the entire tin layer is converted into a planar nickel/copper/tin intermetallic layer 61 on the copper lead 62. The platinum layer 63 was deposited onto the sample prior to focused ion beam cutting and acts as a reference that defines the surface of the tin/Ni/Cu layer.

What is claimed is:

1. A method of reducing the formation of tin whiskers in an electronic interconnection, the method comprising the steps of:
    providing an electronic package including a contact comprising copper, a first layer comprising nickel adjoining the contact, the first layer having a thickness in a range of about 0.05 µm to 1.0 µm, and a second layer comprising tin adjoining the first layer, a weight percentage of nickel relative to tin being in a range of about 1 to 12, the first and second layers being lead-free, and
    heating the electronic package to a temperature of between 232° C. and 500° C. for more than about five seconds to cause melting of the tin and formation of a substantially planar intermetallic material comprising copper, tin and nickel at a copper interface with the contact and having substantially no elemental non-bound tin.

2. The method of claim 1, further comprising heating the electronic package for a time period in a range between 5 seconds and 120 seconds.

3. The method of claim 1, further comprising annealing the electronic package at a temperature of between 100° C. and 200° C. for a time period in a range between about 0.5 hours and eight hours.

4. The method of claim 1, wherein the electronic package includes a chip mounted to a lead frame, the lead frame including the contact.

5. The method of claim 1, wherein a planarity of the intermetallic material is at least about −0.9 µm to +0.9 µm.

6. The method of claim 1, wherein the electronic package is heated to a temperature between 232° C. and 270° C.

7. The method of claim 6, further comprising heating the electronic package for a time period in a range between 5 seconds and 120 seconds.

8. The method of claim 7, wherein the electronic package includes a chip mounted to a lead frame, the lead frame including the contact.

9. The method of claim 7, wherein the electronic package comprises a polymer.

10. A method of reducing the formation of tin whiskers in an electronic interconnection, the method comprising the steps of:
    providing an electrical contact comprising copper;
    forming a first lead-free layer on the electrical contact, the first lead-free layer comprising nickel having a thickness in a range of about 0.05 µm to 1.0 µm;
    forming a second lead-free layer adjoining the first lead-free layer, the second lead-free layer comprising tin, a weight percentage of nickel relative to tin being in a range of about 1 to 12;
    heating the contact and first and second lead-free layers to a temperature of between 232° C. and 270° C. for a time period between 5 seconds and 120 seconds to cause melting of the tin and formation of a substantially planar intermetallic material comprising copper, tin and nickel at a copper interface with the contact and having essentially no elemental non-bound tin.

11. The method of claim 10, wherein a planarity of the intermetallic material is at least about −0.9 µm to +0.9 µm.

12. The method of claim 10, wherein the contact is part of a lead frame.

13. The method of claim 12, wherein the lead frame is part of an electronic package comprising a polymer.

14. The method of claim 12, wherein a weight percentage of nickel relative to lead is in a range of about 3 to 7.

15. An electronic assembly, comprising:
    a lead frame including a plurality of leads comprising copper;
    a chip bonded to the lead frame and encapsulated in a polymer composition;
    a first layer comprising nickel, the first layer formed on and interfacing with the leads and having a thickness between about 0.05 µm to 1.0 µm; and
    a lead-free second layer comprising tin, the second layer overlying the first layer and having a melting point between about 232° C. to 270° C., a weight ratio of nickel in the first layer to tin in the second layer being in a range of about 1% to 12%;
    wherein the plurality of leads and the first and second layers are positioned with respect to each other such that, when the second layer is melted, an intermetallic layer comprising copper, nickel and tin is formed at an interface with the leads after a sufficient time has elapsed, the intermetallic layer having substantially no elemental non-bound tin.

16. The electronic assembly of claim 15, wherein a weight ratio of nickel in the first layer to tin in the second layer is between 3% and 7%.

* * * * *